United States Patent
Moon et al.

(10) Patent No.: US 8,238,857 B2
(45) Date of Patent: Aug. 7, 2012

(54) APPARATUS AND METHOD FOR PERFORMING ATTENUATION FUNCTION IN CABLE BROADCAST RECEIVER

(75) Inventors: Sang-Yeon Moon, Suwon-si (KR);
Geun-Sik Yun, Yongin-si (KR);
Dong-Uk Seo, Cheonan-si (KR);
Sung-Soo Lee, Suwon-si (KR);
Hyun-Jun Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 404 days.

(21) Appl. No.: 12/645,808

(22) Filed: Dec. 23, 2009

(65) Prior Publication Data

US 2010/0159863 A1    Jun. 24, 2010

(30) Foreign Application Priority Data

Dec. 24, 2008    (KR) .................. 10-2008-0133413

(51) Int. Cl.
*H04B 17/02*    (2006.01)
(52) U.S. Cl. ..... 455/136; 455/130; 455/139; 455/150.1; 455/173.3; 455/178.1
(58) Field of Classification Search ............... 455/77, 455/87, 130, 136, 139, 150.1, 173.3, 178.1, 455/182.3, 191.1, 219, 232.1, 234.1, 245.1, 455/251.1
See application file for complete search history.

(56) References Cited

U.S. PATENT DOCUMENTS

| | | | |
|---|---|---|---|
| 2002/0131533 A1* | 9/2002 | Koizumi ................. | 375/345 |
| 2004/0041945 A1* | 3/2004 | Pugel et al. ............. | 348/470 |
| 2008/0132195 A1* | 6/2008 | Maxim et al. ........... | 455/334 |

* cited by examiner

*Primary Examiner* — Tuan Pham
(74) *Attorney, Agent, or Firm* — Jefferson IP Law, LLP

(57) ABSTRACT

An apparatus and a method for performing an attenuation function on a signal using an attenuator in a cable broadcast receiver having a Low Noise Amplifier (LNA) that does not perform an attenuation function on a signal are provided. In the method, an input Radio Frequency (RF) signal is tuned, The RF signal is converted into an Intermediate Frequency (IF) signal. An intensity of the converted IF signal is compared to a threshold, and an RF Automatic Gain Control (AGC) value is generated based on a result of the comparison. When the generated RF AGC value is smaller than an RF AGC threshold, the attenuator is turned on to attenuate the input RF signal by a predefined amount. Therefore, a high SNR, such as in an analog-digital composite signal, may be obtained without using an LNA that performs an attenuation function on a signal.

18 Claims, 3 Drawing Sheets

APPARATUS AND METHOD FOR PERFORMING ATTENUATION FUNCTION IN CABLE BROADCAST RECEIVER

PRIORITY

This application claims the benefit under 35 U.S.C. §119(a) of a Korean patent application filed in the Korean Intellectual Property Office on Dec. 24, 2008 and assigned Serial No. 10-2008-0133413, the entire disclosure of which is hereby incorporated by reference.

BACKGROUND OF THE INVENTION

1. Field of the Invention

The present invention relates to an apparatus and a method for performing an attenuation function in a cable broadcast receiver. More particularly, the present invention relates to an apparatus and a method for performing an attenuation function of a signal using an attenuator in a cable broadcast receiver having a Low Noise Amplifier (LNA) that does not perform an attenuation function of a signal.

2. Description of the Related Art

As a broadcast service using a cable network evolves, an existing analog broadcast service evolves into a digital broadcast service. Accordingly, a broadcast receiver used by a subscriber evolves from an analog broadcast receiver to a digital broadcast receiver or a combined analog and digital broadcast receiver.

A typical broadcast system includes a broadcasting station for transmitting a broadcast signal, and a plurality of subscribers connected to the broadcasting station via an arbitrary medium. Each subscriber has a broadcast receiver for receiving a broadcast signal transmitted from the broadcasting station. The broadcast receiver includes a Low Noise Amplifier (LNA) and a tuner. The LNA attenuates a broadcast signal transmitted from the broadcasting station when the intensity of the signal is greater than a desired signal intensity, and amplifies the signal when the intensity of the signal is smaller than the desired signal intensity. The tuner tunes a frequency selected by a subscriber from broadcast signals transmitted from the broadcasting station. Therefore, a broadcast signal transmitted from the broadcasting station is transmitted to a subscriber via an arbitrary medium, and the transmitted broadcast signal is transmitted to the subscriber via the broadcast receiver.

Generally, the LNA is classified into an active LNA capable of performing both an amplification function and an attenuation function of a signal, and a passive LNA capable of performing only an amplification function of a signal. The active LNA can control an amount of amplification/attenuation, and is two to three times more expensive than a passive LNA since it includes an attenuation function. While the passive LNA has an advantage with respect to price, the passive LNA cannot attenuate an input signal by a desired amount, even when the intensity of the input signal is excessively high. That is, since the passive LNA can only fixedly amplify a preset value, the passive LNA cannot properly operate when the intensity of an input signal is excessively high.

More particularly, in a cable network, an analog channel has a high signal level compared to a digital channel. When extracting an analog channel in this cable network, a broadcast receiver that uses a passive LNA, which does not perform an attenuation function of a signal, obtains a very low Signal-to-Noise Ratio (SNR). This may cause a problem such as an abnormal screen or a frozen screen. Therefore, in this case, the broadcast receiver can only use a high-priced active LNA.

SUMMARY OF THE INVENTION

An aspect of the present invention is to address at least the above-mentioned problems and/or disadvantages and to provide at least the advantages described below. Accordingly, an aspect of the present invention is to provide an apparatus and a method for performing an attenuation function of a cable broadcast receiver.

Another aspect of the present invention is to provide an apparatus and a method for performing an attenuation function on a signal using an attenuator in a cable broadcast receiver having a Low Noise Amplifier (LNA) that does not perform an attenuation function.

Still another aspect of the present invention is to provide an apparatus and a method for obtaining a high Signal-to-Noise Ratio (SNR) by turning on an attenuator and performing an attenuation function on signal in a case where an intensity of an input Radio Frequency (RF) signal is higher than a desired value in a cable broadcast receiver having an LNA that does not perform an attenuation function.

Yet another aspect of the present invention is to provide an apparatus and a method for obtaining a high SNR, such as in an analog-digital composite signal, without using an LNA that performs an attenuation function on a signal in a cable broadcast receiver.

Still another aspect of the present invention is to provide an apparatus and a method for controlling on/off of an attenuator by determining a signal strength and an amount of noise in an RF signal input via a cable according to an SNR, an RF Automatic Gain Control (AGC) value, and attenuator state information in a cable broadcast receiver.

In accordance with an aspect of the present invention, a method for performing an attenuation function on a signal using an attenuator in a broadcast receiver is provided. The method includes tuning an input RF signal, converting the RF signal into an Intermediate Frequency (IF) signal, comparing an intensity of the converted IF signal to a threshold, and generating an RF AGC value based on a result of the comparison, and when the generated RF AGC value is smaller than an RF AGC threshold, turning on the attenuator to attenuate the input RF signal by a predefined amount.

In accordance with another aspect of the present invention, an apparatus for performing an attenuation function on a signal in a broadcast receiver is provided. The apparatus includes an attenuator for attenuating the input RF signal, a tuner for tuning an input RF signal, for converting the input RF signal into an IF signal, for comparing an intensity of the converted IF signal with a threshold, and for generating an RF AGC value based on a result of the comparison, and a controller for obtaining the generated RF AGC value from the tuner, and when the RF AGC value is smaller than an RF AGC threshold, for controlling to turn on the attenuator to allow the attenuator to attenuate the input RF signal by a predefined amount.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention provide an apparatus and a method for performing an attenuation function of a signal using an attenuator in a cable broadcast receiver including an LNA that does not perform an attenuation function on a signal. Here, the cable broadcast receiver denotes a broadcast receiver for receiving a broadcast signal from a cable network. The broadcast receiver may be realized using a Set-Top-Box (STB).

Figure 1:
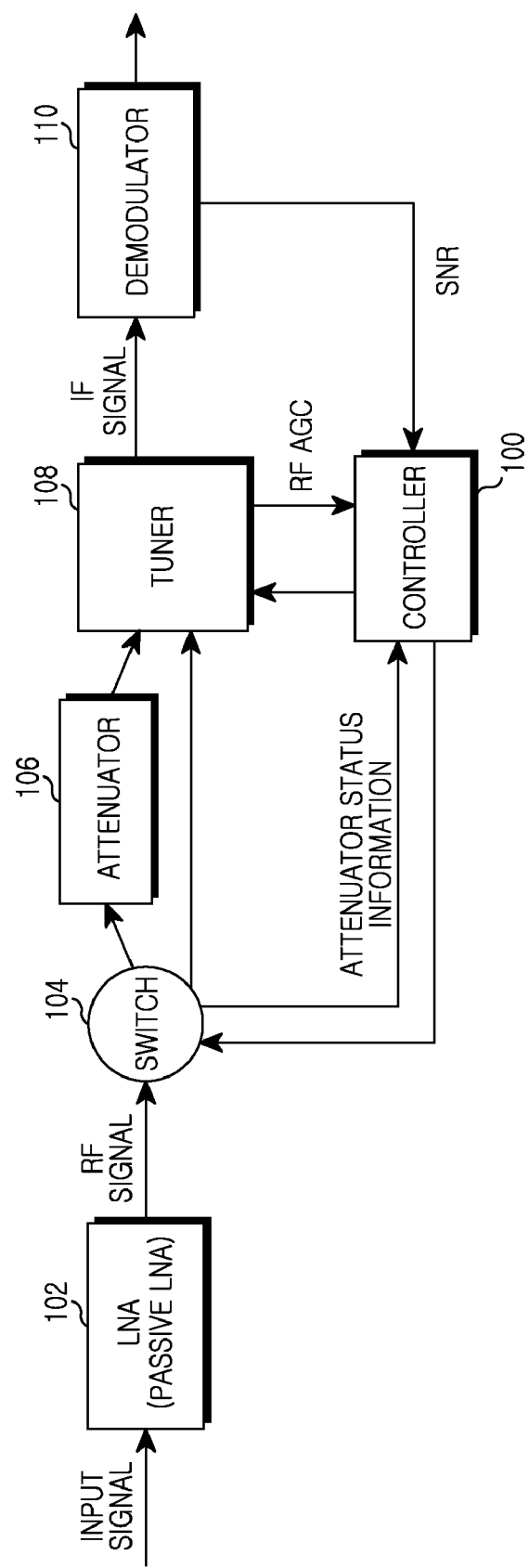
FIG. 1 is a block diagram illustrating a cable broadcast receiver including a passive Low Noise Amplifier (LNA) according to an exemplary embodiment of the present invention.

FIG. 1 is a block diagram illustrating a cable broadcast receiver including a passive Low Noise Amplifier (LNA) according to an exemplary embodiment of the present invention.

As illustrated in FIG. 1, the cable broadcast receiver includes a controller 100, an LNA 102, a switch 104, an attenuator 106, a tuner 108, and a demodulator 110.

Referring to FIG. 1, the controller 100 determines a signal strength and an amount of noise in an Radio Frequency (RF) signal input via a cable using a Signal-to-Noise Ratio (SNR) provided from the demodulator 110, an RF Automatic Gain Control (RF AGC) value provided from the tuner 108, and status information of the attenuator 106 provided from the switch 104, and controls on/off of the attenuator 106 via the switch 104.

The LNA 102 is realized as a passive LNA, and low noise-amplifies an RF signal input via an input connector connected to a cable with a predefined gain.

The switch 104 switches a low-noise amplified RF signal from the LNA 102 to the attenuator 106 or the tuner 108 by turning on/off the attenuator 106 under the control of the controller 100. That is, the switch 104 turns on the attenuator 106 under control of the controller 100 to switch a low noise-amplified RF signal from the LNA 102 to the attenuator 106, or turns off the attenuator 106 under control of the controller 100 to switch a low noise-amplified RF signal from the LNA 102 to the tuner 108. In addition, the switch 104 provides status information of the attenuator 106, that is, information regarding the on/off status of the attenuator 106, to the controller 100.

The attenuator 106 may be realized using a −15 dB mV pad, for example, and is turned on/off under the control of the controller 100 to attenuate an RF signal input from the switch 104 by a predefined amount.

The tuner 108 tunes a frequency selected by a user from RF signals input from the attenuator 106 or the switch 104, and converts the selected RF signal into an Intermediate Frequency (IF) signal. For this purpose, the tuner 108 includes an amplifier (not shown) for amplifying an input RF signal by a predefined amount. At this point, the tuner 108 compares an intensity of the converted IF signal to a threshold, generates an RF AGC signal based on a result of the comparison, and controls a gain (that is, a gain between an input signal and an output signal) of the amplifier (not shown) based on the generated RF AGC signal. At this point, the tuner 108 provides an RF AGC value of the generated RF AGC signal to the controller 100.

Here, when an intensity of an input RF signal is greater than an intensity of a desired signal, an RF AGC value of the RF AGC signal that is smaller than a threshold is generated. When an intensity of an input RF signal is smaller than an intensity of a desired signal, an RF AGC value of the RF AGC signal that is greater than the threshold is generated. Therefore, the controller 100 determines an intensity of an RF signal input via an RF AGC value of the RF AGC signal to control on/off of the attenuator 106. For this purpose, an exemplary embodiment of the present invention defines a Maximum RF AGC value of the RF AGC signal as RF_AGC_MAX, and defines a threshold between the RF AGC maximum value and an RF AGC minimum value of the RF AGC signal as RF_AGC_Thre. When an RF AGC value smaller than RF_AGC_Thre is provided from the tuner 108, the controller 100 determines that an intensity of an input RF signal is greater than an intensity of a desired signal, and can attenuate the input RF signal by a predefined amount by turning on the attenuator 106 depending on whether the attenuator 106 is turned off. In addition, when an RF AGC value of RF_AGC_MAX is provided from the tuner 108, the controller 100 determines that an intensity of an input RF signal is smaller than intensity of a desired signal, and can suspend attenuation of the input RF signal by a predefined amount by turning off the attenuator 106 depending on whether the attenuator 106 is turned on.

The demodulator 110 converts an analog signal input from the tuner 108 into a digital signal, and demodulates the converted digital signal. In addition, the demodulator 110 determines an SNR of the demodulated signal and provides the SNR to the controller 100. The SNR is used for determining an amount of noise in an input RF signal. When an intensity of an input RF signal is smaller or greater than a desired signal intensity, an SNR smaller than a threshold is determined. When an SNR smaller than the threshold is determined, a problem such as an abnormal screen or a frozen screen occurs. In an exemplary embodiment of the present invention, a minimum SNR that does not have a problem such as an abnormal screen and a frozen screen is defined as SNR_MIN. Therefore, when an SNR value smaller than SNR_MIN is provided from the demodulator 110, the controller 100 can determine that an amount of noise in an input RF signal is so strong that it is not acceptable, and that an intensity of an input RF signal is smaller or greater than desired signal strength. Accurate determination as to whether the intensity of the input RF signal is smaller or greater than the desired signal intensity is performed using an RF AGC value provided from the tuner 108. In contrast, when an SNR value not less than SNR MIN is provided from the demodulator 110, the controller 100 determines if an amount of noise in an input RF signal is so low that it is acceptable, and controls the demodulator 110 to demodulate an IF signal input from the tuner 108.

Figure 2:
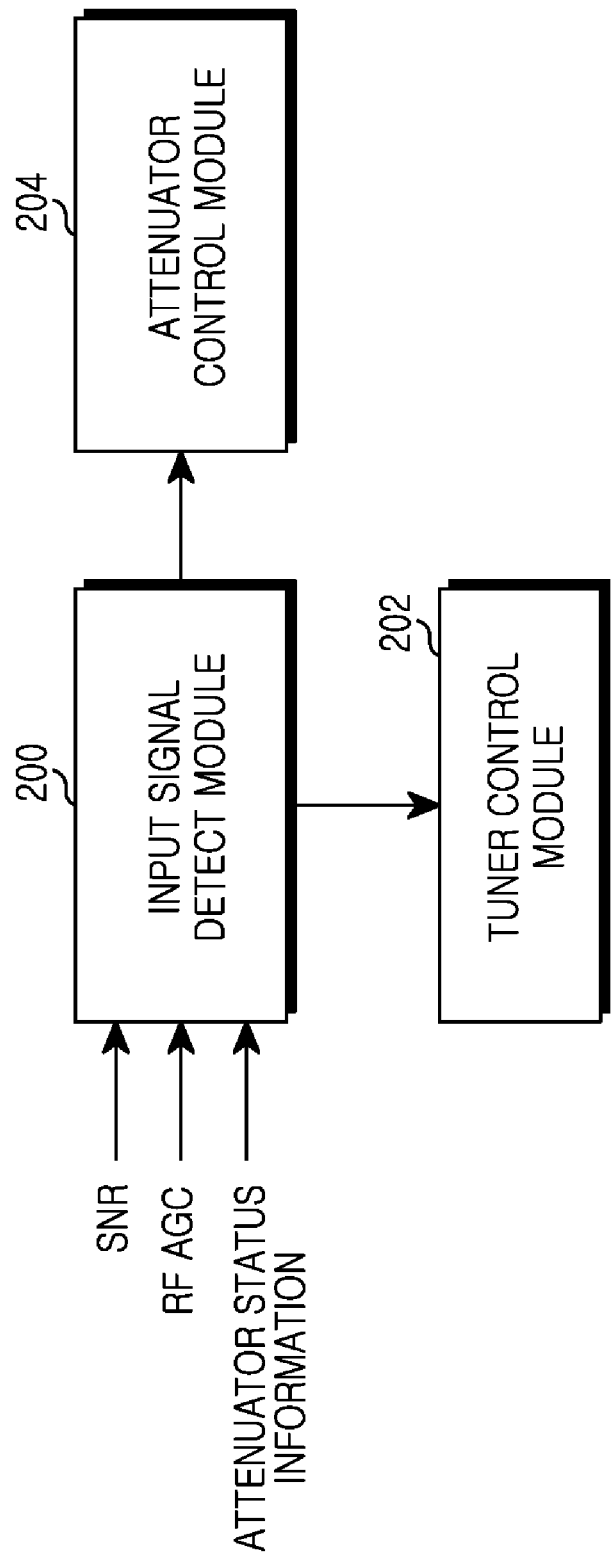
FIG. 2 is a block diagram illustrating a construction of a controller of a cable broadcast receiver including a passive LNA according to an exemplary embodiment of the present invention.

FIG. 2 is a block diagram illustrating a construction of a controller of a cable broadcast receiver including a passive LNA according to an exemplary embodiment of the present invention.

As illustrated in FIG. 2, the controller includes an input signal detect module 200, a tuner control module 202, and an attenuator control module 204.

Referring to FIG. 2, the input signal detect module 200 receives an SNR from the demodulator 110, an RF AGC value from the tuner 108, and status information of the attenuator 106 from the switch 104, and accordingly, determines an intensity of, and an amount of, noise in an RF signal input via a cable, determines on/off of the attenuator 106, and outputs a result of the determination to the attenuator control module 204. In addition, the input signal detect module 200 may determine whether to perform retuning when a status of the attenuator 106 changes depending on the determination, and accordingly, may output information as to whether to perform retuning to the tuner control module 202.

The attenuator control module 204 controls on/off of the attenuator 106 using the switch 104 depending on a result of the determination from the input signal detect module 200.

The tuner control module 202 provides information as to whether to perform retuning from the input signal detect signal 200 to the tuner 108.

Figure 3:
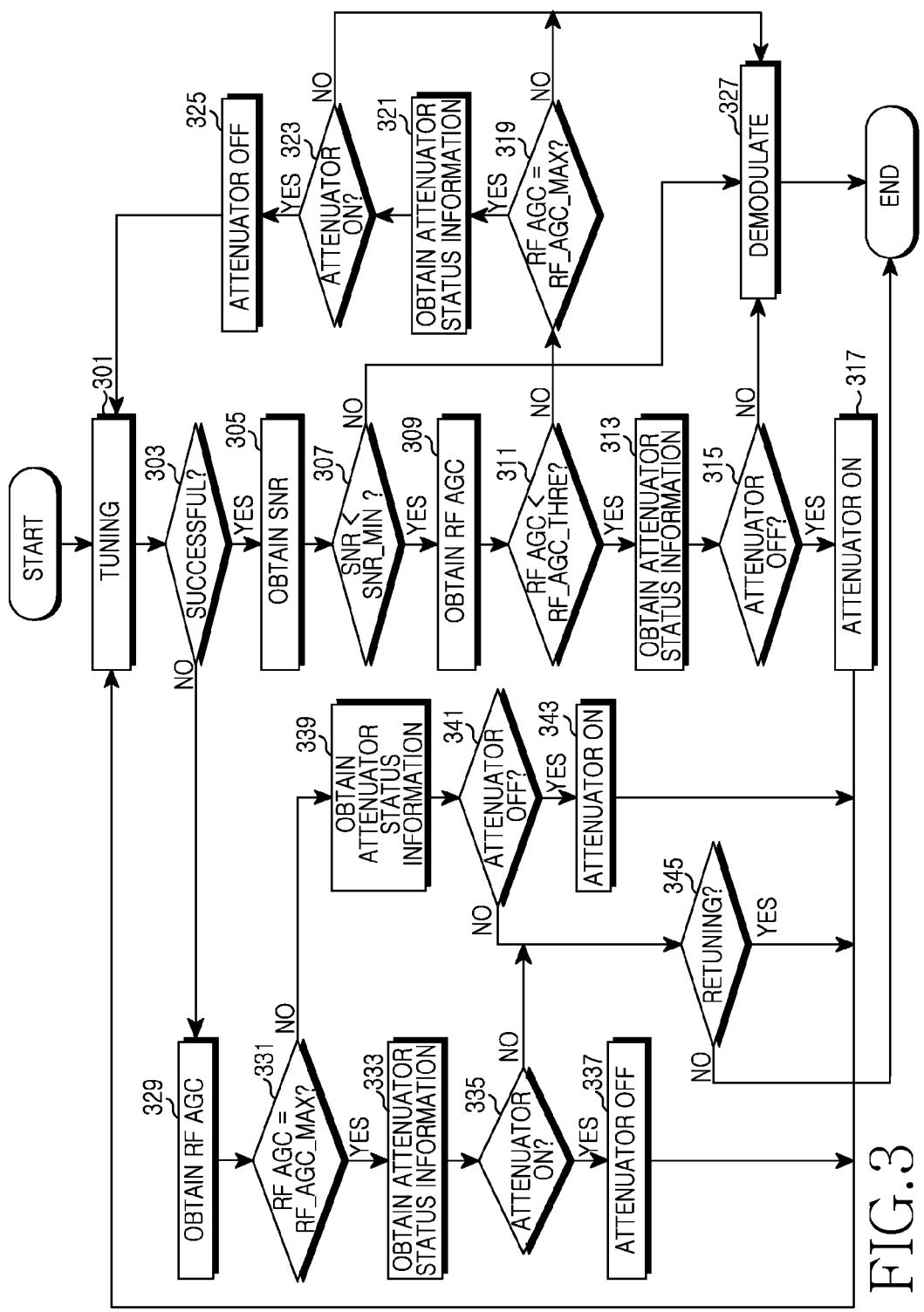
FIG. 3 is a flowchart illustrating a method for performing an attenuation function on a signal using an attenuator in a cable broadcast receiver including a passive LNA according to an exemplary embodiment of the present invention.

FIG. 3 is a flowchart illustrating a method for performing an attenuation function of a signal using an attenuator in a cable broadcast receiver including a passive LNA according to an exemplary embodiment of the present invention.

Referring to FIG. 3, the cable broadcast receiver tunes a frequency selected by a user from input RF signals, and converts the tuned signal into an IF signal in step 301. The cable broadcast receiver determines whether the tuning has been successful in step 303.

When it is determined that the tuning has been successful in step 303, the cable broadcast receiver obtains an SNR from a demodulator in step 305, and determines whether the obtained SNR is smaller than SNR MIN in step 307. When it is determined that the obtained SNR is not less than SNR MIN in step 307, the cable broadcast receiver determines that an amount of noise in an input RF signal is so low that it is acceptable, and demodulates the signal tuned and converted into an IF signal in step 327.

In contrast, when it is determined that the obtained SNR is less than SNR_MIN in step 307, the cable broadcast receiver determines that an amount of noise in an input RF signal is so high that it is not acceptable, and that intensity of the input RF signal is smaller or greater than desired signal intensity. The cable broadcast receiver obtains an RF AGC value from a tuner in order to determine whether intensity of the input RF signal is smaller or greater than a desired signal intensity in step 309.

The cable broadcast receiver determines whether the obtained RF AGC value is smaller than RF_AGC_Thre in step 311. When it is determined that the obtained RF AGC value is smaller than RF_AGC_Thre in step 311, the cable broadcast receiver determines that an intensity of an input RF signal is greater than a desired signal intensity, obtains attenuator status information from a switch in step 313, and determines whether an attenuator has been turned off using the obtained attenuator status information in step 315. When it is determined that the attenuator has been turned off in step 315, the cable broadcast receiver turns on the attenuator so that the attenuator attenuates the input RF signal by a predefined amount in step 317, and returns to step 301 to repeatedly perform retuning and the subsequent steps. In contrast, when it is determined that the attenuator has been turned off in step 315, the cable broadcast receiver determines that the intensity of the input signal is high even though the input RF signal has been attenuated by a predefined amount using the attenuator and thus more control is not required, and demodulates the signal tuned and converted into an IF signal in step 327.

Returning to step 311, when it is determined that the obtained RF AGC value is not less than RF_AGC_Thre, the cable broadcast receiver determines that an intensity of an input RF signal is smaller than a desired signal intensity, and determines whether the obtained RF AGC value is equal to RF_AGC_MAX in step 319. When it is determined that the obtained RF AGC value is equal to RF_AGC_MAX in step 319, the cable broadcast receiver obtains attenuator status information from the switch in step 321 in order to determine whether the obtained SNR is low because the attenuator has been turned on and attenuated the input RF signal by a predefined amount. The cable broadcast receiver determines whether the attenuator has been turned on using the obtained attenuator status information in step 323. When it is determined that the attenuator has been turned on in step 323, the cable broadcast receiver turns off the attenuator so that the attenuator suspends attenuation of an input RF signal by a predefined amount in step 325, and returns to step 301 to repeatedly perform retuning and the subsequent steps. In contrast, when it is determined that the obtained RF AGC value is not equal to RF AGC MAX in step 319 or the attenuator has been turned off in step 323, the cable broadcast receiver determines that more control is not necessary, and demodulates the signal tuned and converted into an IF signal in step 327.

Returning to step 303, when it is determined that the tuning fails, the cable broadcast receiver obtains an RF AGC value from a tuner in step 329, and determines whether the obtained RF AGC value is equal to RF_AGC_MAX in step 331.

When it is determined that the obtained RF AGC value is equal to RF_AGC_MAX in step 331, the cable broadcast receiver determines that an intensity of an input RF signal is smaller than a desired signal intensity, and obtains attenuator status information from the switch in order to determine whether the intensity of the RF signal is smaller than the desired signal intensity because the attenuator has been turned on and attenuated the input RF signal by a predefined amount in step 333.

The cable broadcast receiver determines whether the attenuator has been turned on using the obtained attenuator status information in step 335. When it is determined that the attenuator has been turned on in step 335, the cable broadcast receiver turns off the attenuator so that the attenuator suspends attenuation of an input RF signal by a predefined amount in step 337, and returns to step 301 to perform retuning and the subsequent steps. In contrast, when it is determined that the attenuator has been turned off in step 335, the cable broadcast receiver determines whether to perform retuning in step 345. When determining to perform retuning, the cable broadcast receiver returns to step 301 to perform retuning and the subsequent steps. In contrast, when determining not to perform retuning, the cable broadcast receiver ends the operation according to an exemplary embodiment of the present invention. Here, when tuning fails again despite the attenuator having been turned on/off and retuning having been performed after a tuning failure, the cable broadcast receiver determines not to perform retuning. Otherwise, the cable broadcast receiver determines to perform retuning.

Returning to step 331, when it is determined that the obtained RF AGC value is not the same as RF_AGC_MAX, the cable broadcast receiver determines that an intensity of an input RF signal is greater than a desired signal intensity, and obtains attenuator status information from the switch in order to determine whether the intensity of the input RF signal is greater than the desired signal intensity because the attenuator has been turned off and suspended attenuation of the input RF signal by a predefined amount in step 339.

The cable broadcast receiver determines whether the attenuator has been turned off using the obtained attenuator status information in step 341. When it is determined that the attenuator has been turned off, the cable broadcast receiver turns on the attenuator so that the attenuator attenuates the input RF signal by a predefined amount in step 343, and returns to step 301 to perform retuning and the subsequent steps. In contrast, when it is determined that the attenuator has been turned on in step 341, the cable broadcast receiver determines whether to perform retuning in step 345. When determining to perform retuning, the cable broadcast receiver returns to step 301 to perform retuning and the subsequent steps. In contrast, when determining not to perform retuning, the cable broadcast receiver ends the operation according to an exemplary embodiment of the present invention. Here, when tuning fails again despite the attenuator having been turned off and retuning having been performed after tuning failure, the cable broadcast receiver determines not to perform retuning. Otherwise, the cable broadcast receiver determines to perform retuning.

Thereafter, the cable broadcast receiver ends the operation according to an exemplary embodiment of the present invention.

As described above, a cable broadcast receiver having an LNA that does not perform an attenuation function on a signal can obtain a high SNR, such as in an analog-digital composite signal, without using an LNA that performs an attenuation function on a signal by turning on an attenuator and performing an attenuation function on a signal when intensity of an input RF signal is greater than a desired value.

While the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. A method for performing an attenuation function on a signal using an attenuator in a broadcast receiver, the method comprising:

tuning an input Radio Frequency (RF) signal;

converting the RF signal into an Intermediate Frequency (IF) signal;

comparing an intensity of the converted IF signal to a threshold, and generating an RF Automatic Gain Control (AGC) value based on a result of the comparison; and when the generated RF AGC value is smaller than an RF AGC threshold, turning on the attenuator to attenuate the input RF signal by a predefined amount.

2. The method of claim 1, further comprising:

when the generated RF AGC value is smaller than the RF AGC threshold, determining a status of the attenuator; and when the determined status of the attenuator is an on-status, demodulating the converted IF signal.

3. The method of claim 1, further comprising:

determining whether the tuning is successful;

when the tuning is determined to be successful, determining a Signal-to-Noise Ratio (SNR) of the input RF signal; and when the determined SNR is equal to or greater than an SNR threshold, demodulating the converted IF signal, wherein the generating of the RF AGC value is performed when the determined SNR is smaller than the SNR threshold.

4. The method of claim 3, further comprising:

when the tuning fails, comparing the intensity of the converted IF signal with the threshold, and generating an RF AGC value based on a result of the comparison;

determining whether the generated RF AGC value is equal to an RF AGC maximum value;

when the generated RF AGC value is equal to the RF AGC maximum value, determining a status of the attenuator;

when the determined status of the attenuator is an on-status, turning off the attenuator to suspend attenuation of the input RF signal by a predefined amount; and when the determined status of the attenuator is an off-status, determining whether to perform retuning and performing retuning of the input RF signal depending on a result of the determination.

5. The method of claim 4, wherein the determining of whether to perform the retuning comprises:

determining whether a current tuning is a retuning;

when the current tuning is retuning, determining not to perform retuning; and when the current tuning is not retuning, determining to perform retuning.

6. The method of claim 4, further comprising:

when the generated RF AGC value is different from the RF AGC maximum value, determining a status of the attenuator;

when the determined status of the attenuator is an off-status, turning on the attenuator to attenuate the input RF signal by a predefined amount; and when the determined status of the attenuator is an on-status, determining whether to perform retuning, and performing retuning of the input RF signal depending on a result of the determination.

7. The method of claim 1, further comprising:
when the generated RF AGC value is not less than the RF AGC threshold, determining whether the generated RF AGC value is equal to an RF AGC maximum value;
when the generated RF AGC value is different from the RF AGC maximum value, demodulating the converted IF signal;
when the generated RF AGC value is equal to the RF AGC maximum value, determining a status of the attenuator;
when the determined status of the attenuator is an on-status, turning off the attenuator to suspend attenuation of the input RF signal by a predefined amount; and
when the determined status of the attenuator is an off-status, demodulating the converted IF signal.

8. The method of claim 1, wherein the broadcast receiver comprises a broadcast receiver having a passive Low Noise Amplifier (LNA).

9. An apparatus for performing an attenuation function on a signal in a broadcast receiver, the apparatus comprising:
an attenuator for attenuating the input RF signal;
a tuner for tuning an input Radio Frequency (RF) signal, for converting the input RF signal into an Intermediate Frequency (IF) signal, for comparing an intensity of the converted IF signal to a threshold, and for generating an RF Automatic Gain Control (AGC) value based on a result of the comparison; and
a controller for obtaining the generated RF AGC value from the tuner, and when the RF AGC value is smaller than an RF AGC threshold, for controlling to turn on the attenuator to allow the attenuator to attenuate the input RF signal by a predefined amount.

10. The apparatus of claim 9, wherein when the obtained RF AGC value is smaller than the RF AGC threshold, the controller determines a status of the attenuator, when the determined status of the attenuator is an on-status, controls a demodulator to demodulate the converted IF signal, and when the determined status of the attenuator is an off-status, controls to turn on the attenuator to allow the attenuator to attenuate the input RF signal by a predefined amount.

11. The apparatus of claim 9, further comprising a demodulator for determining a Signal-to-Noise Ratio (SNR) of the input RF signal,
wherein the controller determines whether the tuning is successful, when the tuning is determined to be successful, obtains the determined SNR from the demodulator, determines whether the obtained SNR is smaller than an SNR threshold, when the obtained SNR is equal to or greater than the SNR threshold, controls the demodulator to demodulate the converted IF signal, and when the obtained SNR is smaller than the SNR threshold, obtains the generated RF AGC value from the tuner.

12. The apparatus of claim 11, wherein when the tuning fails, the controller obtains the generated RF AGC value from the tuner, determines whether the obtained RF AGC value is equal to an RF AGC maximum value, when the obtained RF AGC value is equal to the RF AGC maximum value, determines a status of the attenuator, when the determined status of the attenuator is an on-status, controls to turn off the attenuator to allow the attenuator to suspend attenuation of the input RF signal by a predefined amount, and when the determined status of the attenuator is an off-status, determines whether to perform retuning and informs the tuner of a result of the determination.

13. The apparatus of claim 12, wherein the controller determines whether a current tuning is a retuning, when the current tuning is retuning, determines not to perform retuning, and when the current tuning is not retuning, determines to perform retuning.

14. The apparatus of claim 12, wherein when the obtained RF AGC value is different from the RF AGC maximum value, the controller determines the status of the attenuator, when the determined status of the attenuator is an off-status, controls to turn on the attenuator to allow the attenuator to attenuate the input RF signal by a predefined amount, and when the determined status of the attenuator is an on-status, determines whether to perform retuning and informs the tuner of a result of the determination.

15. The apparatus of claim 9, wherein when the obtained RF AGC value is not less than the RF AGC threshold, the controller determines whether the obtained RF AGC value is equal to an RF AGC maximum value, when the obtained RF AGC value is different from the RF AGC maximum value, controls a demodulator to demodulate the converted IF signal, when the obtained RF AGC value is equal to the RF AGC maximum value, determines a status of the attenuator, when the determined status of the attenuator is an on-status, controls to turn off the attenuator to allow the attenuator to suspend attenuation of the input RF signal by a predefined amount, and when the determined status of the attenuator is an off-status, controls the demodulator to demodulate the converted IF signal.

16. The apparatus of claim 9, further comprising a passive Low Noise Amplifier (LNA) for low noise amplifier the input RF signal.

17. The apparatus of claim 9, further comprising a switch, controlled by the controller, for turning on the attenuator to allow the attenuator to attenuate the input RF signal by the predefined amount.

18. The apparatus of claim 17, wherein the switch provides the controller with attenuator status information.

* * * * *